(12) United States Patent
Yoshikawa (10) Patent No.: US 6,222,729 B1
(45) Date of Patent: Apr. 24, 2001

(54) ELECTRONIC DEVICE COOLING SYSTEM HAVING GUIDES FOR GUIDING A FLOW OF THE AIR EVENLY

(75) Inventor: Minoru Yoshikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/359,888

(22) Filed: Jul. 26, 1999

(30) Foreign Application Priority Data

Jul. 28, 1998 (JP) .................................................. 10-213079

(51) Int. Cl.$^7$ ....................................................... H05K 7/20
(52) U.S. Cl. ........................ 361/695; 361/690; 361/694; 174/161; 454/184
(58) Field of Search ........................... 361/687, 690–695, 361/697, 717–719; 174/15.1, 16.1; 165/80.3, 121–126; 454/184; 364/708.1

(56) References Cited

U.S. PATENT DOCUMENTS

| | | | |
|---|---|---|---|
| 4,158,875 | * | 6/1979 | Tajima et al. ........................ 361/695 |
| 4,894,749 | * | 1/1990 | Elko et al. ............................ 361/690 |
| 5,063,477 | * | 11/1991 | Paggen et al. ........................ 361/695 |
| 5,210,680 | * | 5/1993 | Scheibler ............................... 361/695 |
| 5,414,591 | | 5/1995 | Kimura et al. ........................ 361/695 |
| 5,428,503 | * | 6/1995 | Matsushima et al. ................ 361/695 |
| 5,544,012 | * | 8/1996 | Koike .................................... 361/695 |
| 5,762,550 | * | 6/1998 | Brunner ................................ 454/184 |
| 5,793,610 | * | 8/1998 | Schmitt et al. ........................ 361/695 |
| 5,914,858 | * | 6/1999 | McKeen et al. ...................... 361/695 |
| 6,005,770 | * | 12/1999 | Schmitt ................................. 361/695 |
| 6,011,688 | * | 1/2000 | Thornburg et al. ................... 361/695 |
| 6,011,689 | * | 1/2000 | Wrycraft .............................. 361/695 |

FOREIGN PATENT DOCUMENTS

| | | |
|---|---|---|
| 26 35 445 | 2/1978 | (DE) . |
| 298 04 396 U | 6/1998 | (DE) . |
| 2-54998 | 2/1990 | (JP) . |
| 231191 | 2/1990 | (JP) . |
| 2-278896 | 11/1990 | (JP) . |
| 394 | 1/1991 | (JP) . |
| 3-268484 | 11/1991 | (JP) . |
| 5206668 | 8/1993 | (JP) . |
| 8-32248 | 2/1996 | (JP) . |
| 1023618 | 1/1998 | (JP) . |

* cited by examiner

Primary Examiner—Leo P. Picard
Assistant Examiner—Boris L. Chervinsky
(74) Attorney, Agent, or Firm—Young & Thompson (57) ABSTRACT

A cooling system for an electronic device having a plurality of multistage circuit boards therein includes a plurality of inlet-side guides arranged in parallel on an inlet port side of the plurality of circuit boards in a direction of a flow of the air taken in from an inlet port. The inlet-side guides are each inclined at a predetermined angle toward a side opposite to the inlet port to deflect the inlet air away from the circuit boards. A plurality of fans blow onto the circuit boards the air guided by the plurality of inlet-side guides. The system may further include a mesh member between the circuit boards and the fans.

22 Claims, 7 Drawing Sheets

PRIOR ART
Fig. 7

ELECTRONIC DEVICE COOLING SYSTEM HAVING GUIDES FOR GUIDING A FLOW OF THE AIR EVENLY

BACKGROUND OF THE INVENTION

The present invention relates to a cooling system of an electronic device having a plurality of circuit boards therein.

In a conventional electronic device in which many circuit boards are installed, the circuit boards are arranged vertically in multiple stages to reduce the signal propagation delay time among the circuit boards.

Figure 7:
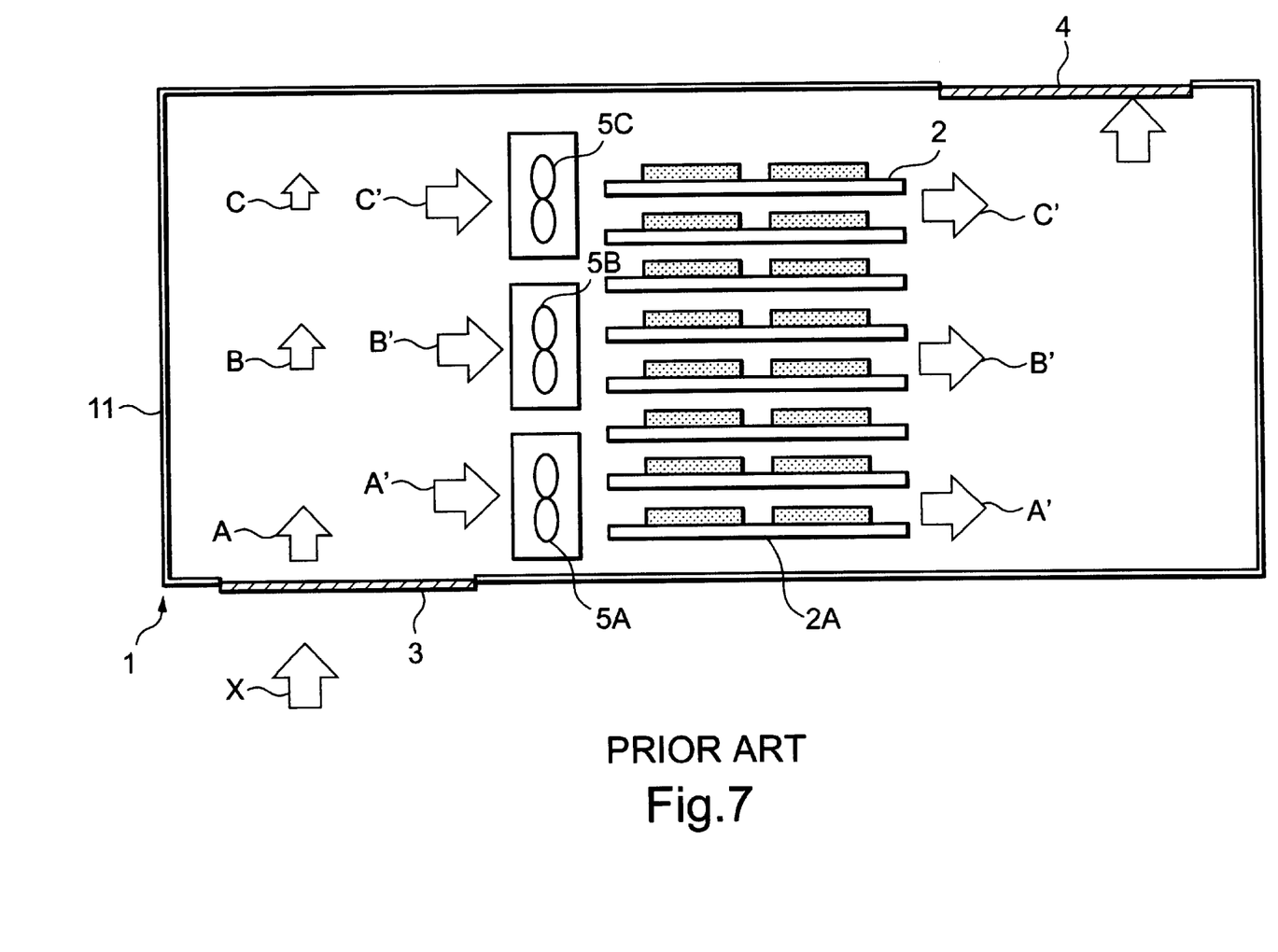
FIG. 7 is a sectional view showing the cooling system used in a conventional electronic device.

Referring to FIG. 7, a conventional electronic device 1 comprises a plurality of circuit boards 2, each having a plurality of electronic components such as large-scale integrated circuits (LSIs) and integrated circuits (ICs) thereon, and a cabinet 11 in which these circuit boards 2 are installed in multiple stages arranged vertically. On the bottom of the cabinet 11 is provided an inlet port 3 through which air (cool air) is taken into the cabinet 11; on the top of the cabinet 11 is provided an exhaust port 4 through which air is exhausted from the cabinet 11. In addition, to blow cool air taken in through the inlet port 3 onto the electronic components on the circuit boards 2 and to cool them, a plurality of fans 5 are provided on the inlet port sides of the circuit boards 2.

In the conventional electronic device 1 such as the one described above, the fans 5 take in air through the inlet port 3 into the cabinet 11 to supply it to the plurality of circuit boards 2. The air, warmed by the electronic components on the circuit boards 2, is exhausted from the cabinet 11 through the exhaust port 4.

When the heat generated by the electronic components in the conventional electronic device 1 becomes high, the temperature of the room (hereinafter called "machine room") where electronic device 1 is mounted rises. This warms the air blown by the fans 5 onto the electronic components, making it difficult to cool the electronic components properly.

In such a case, an air conditioning system is usually provided in the machine room to lower the temperature of the air in the room. In a machine room where a large electronic device is installed, the so-called floor air-conditioning system that supplies cool air under the floor is usually used. In this system, air blown up from under the floor cools the inside of the electronic device.

In FIG. 7, the wind speed at arrow X at which cool air is blown up from under the floor is, usually, as high as 2 meter to 3 meter per second. Inside the cabinet 11, the larger the distance from the inlet port 3, the lower the speed of the cool air. That is, the wind speeds inside the cabinet 11 are in order of (wind speed at arrow A)>(wind speed at arrow B)>(wind speed at arrow C). The lower the speed of the cool air that is blown upward, the easier it is to catch the cool air. This means that it is easier for a fan 5C arranged near the top of the cabinet 11 to catch the cool air. Conversely, it is difficult for a fan 5A provided near the bottom of the cabinet 11 to catch the cool air because the speed of the cool air blown upward is high. That is, the amounts of the cool air caught by the fans 5A to 5C and supplied to the circuit boards 2 are in the order of (amount of cool air at arrow C')>(amount of cool air at arrow B')>(amount of cool air at arrow A'). Therefore, the cool air flowing slowly near a circuit board 2a installed near the bottom of the cabinet 11 does not have a sufficient cooling effect as compared with the cool air flowing somewhere else in the cabinet 11. In some cases, the speed of the cool air falls below a predetermined level with the result that the lower-stage circuit board 2A cannot be cooled enough.

In such a case, for blowing a wind at a predetermined speed near the lower-stage circuit board 2A, it is required that the fans 5 are more powerful or a larger distance from the inlet port 3 to the fans 5. However, this configuration makes the fans 5 noisier and the cabinet 11 larger.

SUMMARY OF THE INVENTION

It is an object of the present invention to provide an electronic device cooling system, which supplies winds evenly among a plurality of circuit boards in an electronic device containing multistage circuit boards arranged vertically.

One aspect of the present invention is an electronic device cooling system comprising a cabinet; a plurality of circuit boards, installed in said cabinet, having electronic parts thereon; an inlet port through which air is taken into said cabinet; and a plurality of inlet-side guides, arranged in parallel on an inlet port side of said plurality of circuit boards in a direction of a flow of the air taken in from said inlet port, guiding said air taken in from said inlet port away from the circuit boards.

Another aspect of the present invention is an electronic device cooling system comprising a cabinet; a plurality of circuit boards, installed in said cabinet, having electronic parts thereon; an exhaust port through which air is exhausted from said cabinet; a plurality of exhaust-side guides, arranged in parallel on an exhaust port side of said plurality of circuit boards in a direction of a flow of the air exhausted from said exhaust port and each inclined at a predetermined angle toward said exhaust port, guiding the air warmed by said electronic parts on said circuit boards; and a plurality of fans between the circuit boards and the exhaust-side guides exhausting the air warmed by said electronic parts on said circuit boards from said exhaust port via said plurality of exhaust-side guides.

A still another aspect of the present invention is an electronic device cooling system comprising a cabinet; a plurality of circuit boards, installed in said cabinet and having electronic parts thereon; an inlet port through which air is taken into said cabinet; a plurality of inlet-side guides, arranged in parallel in a direction of a flow of the air taken in from said inlet port and each inclined at a predetermined angle toward a side opposite to said inlet port, guiding the air taken in from said inlet port away from the circuit boards; a plurality of first fans blowing onto said circuit boards the air taken in through said inlet port and guided by said plurality of inlet-side guides; an exhaust port through which the air is exhausted from said cabinet; a plurality of exhaust-side guides, arranged in parallel in a direction of a flow of the air exhausted from said exhaust port and each inclined at a predetermined angle toward said exhaust port, guiding the air warmed by said electronic parts; and a plurality of second fans exhausting the warmed air from said exhaust port via said plurality of exhaust-side guides.

BRIEF DESCRIPTION OF THE DRAWINGS

The invention will be understood more fully from the detailed description given here below and from the accompanying drawings of preferred embodiments of the invention.

DESCRIPTION OF THE PREFERRED EMBODIMENTS

The present invention will be described in detail by referring to the attached drawings.

Figure 1:
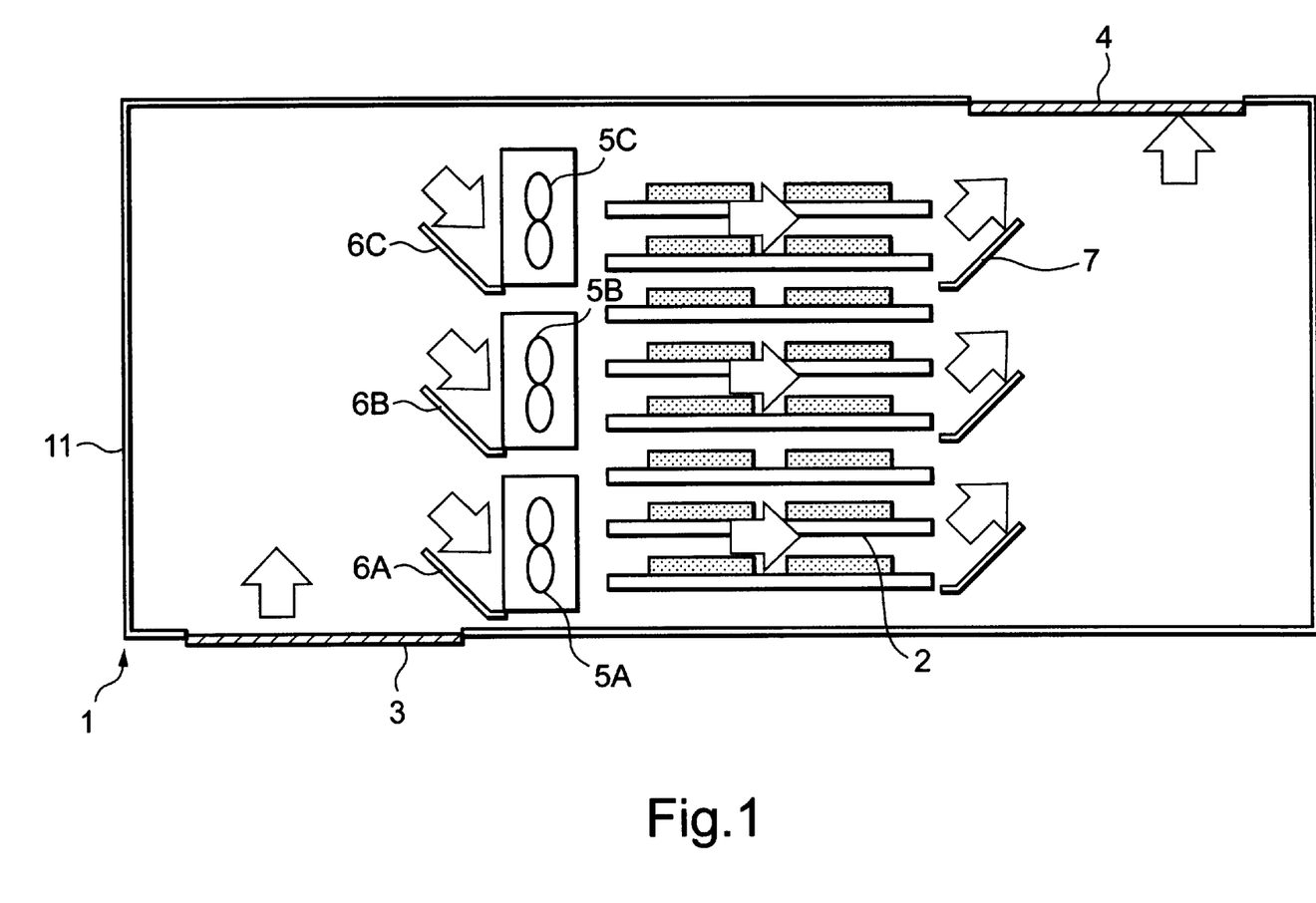
FIG. 1 is a sectional view showing a first embodiment of the present invention.

Referring to FIG. 1, a first embodiment of the present invention comprises a plurality of circuit boards 2, each having a plurality of electronic components such as large-scale integrated circuits (LSIS) and integrated circuits (ICs) thereon, and a cabinet 11 in which these circuit boards 2 are installed in multiple stages arranged vertically. On the bottom of the cabinet 11 is provided an inlet port 3 through which air (cool air) is taken into the cabinet 11. On the top of the cabinet 11 is provided an exhaust port 4 through which air is exhausted from the cabinet 11. To blow cool air taken in through the inlet port 3 onto the electronic components on the circuit boards 2 and to cool them, a plurality of fans 5 are provided on the inlet port sides of the circuit boards 2. The fans 5 are not necessary absolutely. It is possible to implement even if there are not any fans 5. In addition, a plurality of inlet-side guides 6 are provided on the inlet port 3 side of the fans 5. Further, a plurality of exhaust-side guides 7 are provided on the exhaust port 4 side which is opposite to the fans 5 across the circuit boards 2.

In this embodiment, a total of six (vertical three by horizontal two) fans 5, arranged in the matrix form, are installed vertically on the bottom of the cabinet 11 (In FIG. 1, only three fans on the front are shown).

One inlet-side guide 6 and one exhaust-side guide 7 are arranged for each horizontal row of fans 5. The inlet-side guides 6 are arranged in the direction in which the air taken in through the inlet port 3 flows, while the exhaust-side guides 7 in the direction in which the air flows toward the exhaust port 4. Each inlet-side guide 6 extends obliquely upward from the bottom of the corresponding fan 5. So does the exhaust-side guide 7. That is, the inlet-side guides 6 are each inclined toward the side opposite to the inlet port 3 at a predetermined angle, and the exhaust-side guides 7 toward the exhaust port 4 at a predetermined angle. The predetermined angle must be appropriately selected considering the amount of wind required for cooling the circuit boards 2 and the position of the exhaust port 4. In most cases, an angle of 30 to 45 degrees is preferable.

Inclining the inlet-side guides 6 toward the side opposite to the inlet port 3 allows even the fan 5 near the bottom of the cabinet 11 to catch the cool air taken in into the cabinet 11 through the inlet port 3 easily.

However, even in this configuration, the fan 5 nearest to the inlet port 3 sometimes cannot catch the air sufficiently.

Next, a second embodiment of the present invention will be described.

Figure 2:
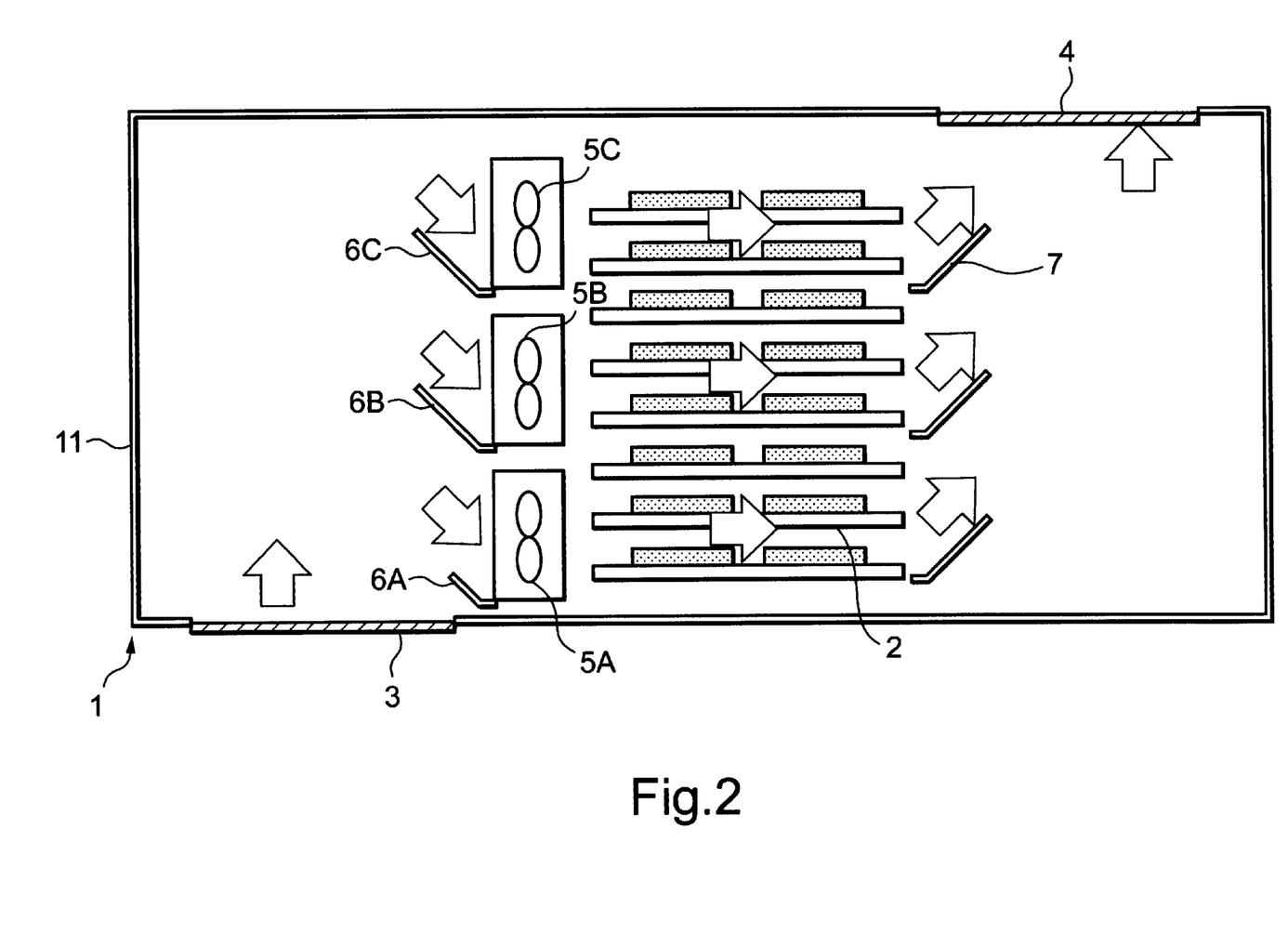
FIG. 2 is a sectional view showing a second embodiment of the present invention.

As shown in FIG. 2, the second embodiment of the present invention has the same configuration as that of the first embodiment except that a length of the inlet-side guide 6A nearest to the inlet port 3 is about the half length of the other inlet-side guides 6B–6C. This configuration allows the fan 5A nearest to the inlet port 3 to catch the wind more efficiently.

As in the first embodiment, the air taken in through the inlet port 3 flows upward first, then obliquely downward along the inlet-side guides 6A–6C, and then, blown by the fans 5A–5C, horizontally across the circuit boards 2. Forcing the airflow to change in this way, the airing resistance of the air paths of the fans 5A–5C increases. That is, changing the air paths to the fans 5A–5C keeps the air amount well balanced among the fans 5A–5C arranged at different distances from the inlet port 3. Therefore, as in this embodiment, shortening the length of the inlet-side guide 6A nearest to the inlet port 3 in order to reduce the airing resistance of the corresponding fan 5A, the fan 5A can catch the air more easily. This short inlet-side guide 6A resolves the problem of varying wind speeds among the fans 5A–5C caused by their installation positions.

Another problem is that, when a plurality of circuit boards are arranged in each fan row, the speed of the wind blowing onto the circuit board at the center of the fan is lower than the speed of the wind blowing onto the circuits boards not at the center of the fan. This is because, when an axial fan is used, a strong wind blows in the outer part where there are wings of the fan, but not in the center where there is the motor which turns the fans.

Figure 3:
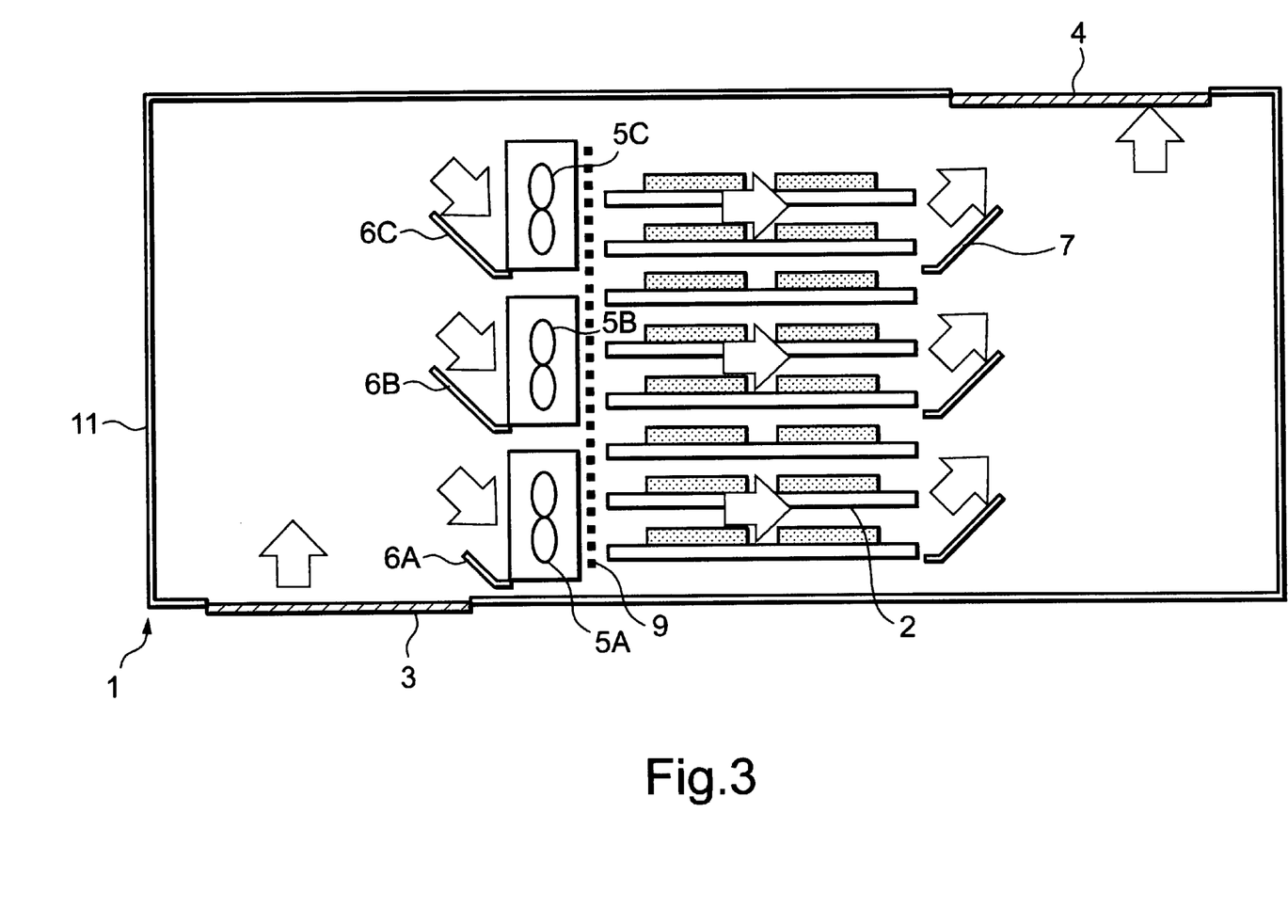
FIG. 3 is a sectional view showing a third embodiment of the present invention.

To solve this problem, a third embodiment of the present invention shown in FIG. 3, a mesh member 9 has inserted between the fans 5 and the circuit boards 2. The mesh member 9 is composed of a plurality of vertical and horizontal wires crossing with each other. Inserting the mesh member 9, as the guides are provided, the airing resistance increases. The mesh member 9 makes the speed of the winds passing through the meshes of the mesh member 9 equal. A mesh member, called a 24-mesh, is most advantageous. It is composed of wires arranged crosswise in a grid of 24 wires to the inch, each 0.29 mm in diameter.

Figure 4:
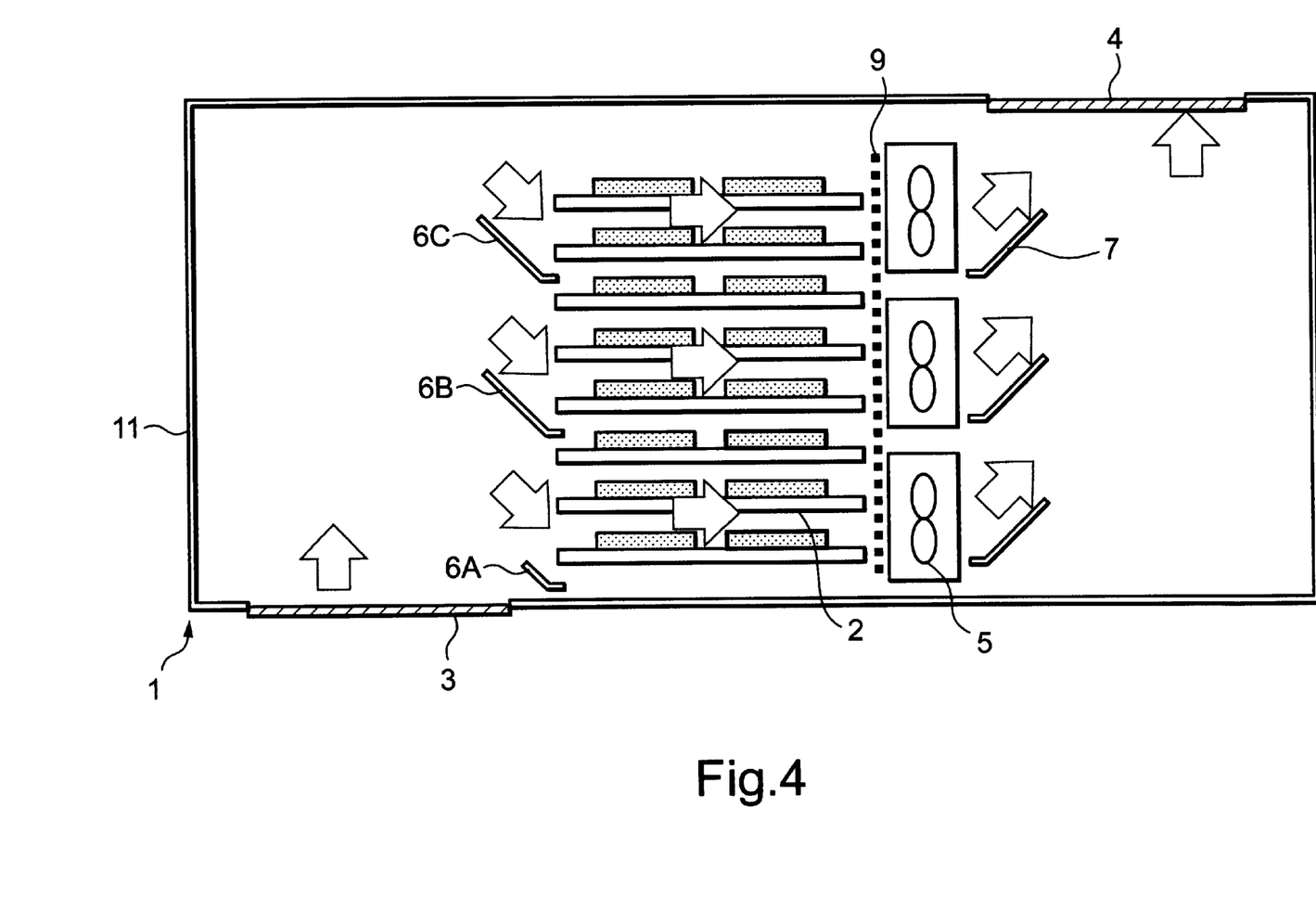
FIG. 4 is a sectional view showing a fourth embodiment of the present invention.

FIG. 4 shows a fourth embodiment of the present invention. In this embodiment, the fans 5 used in the third embodiment are inserted between the plurality of circuit boards 2 and the plurality of exhaust-side guides 7. At the same time, the mesh member 9 used in the third embodiment is inserted between the circuit boards 2 and the fans 5. The exhaust-side guides 7 extend upward obliquely toward the exhaust port 4, so the exhaust air of the fan 5 near the top from does not disturb the exhaust air of the fan 5 arranged near the bottom.

Figure 5:
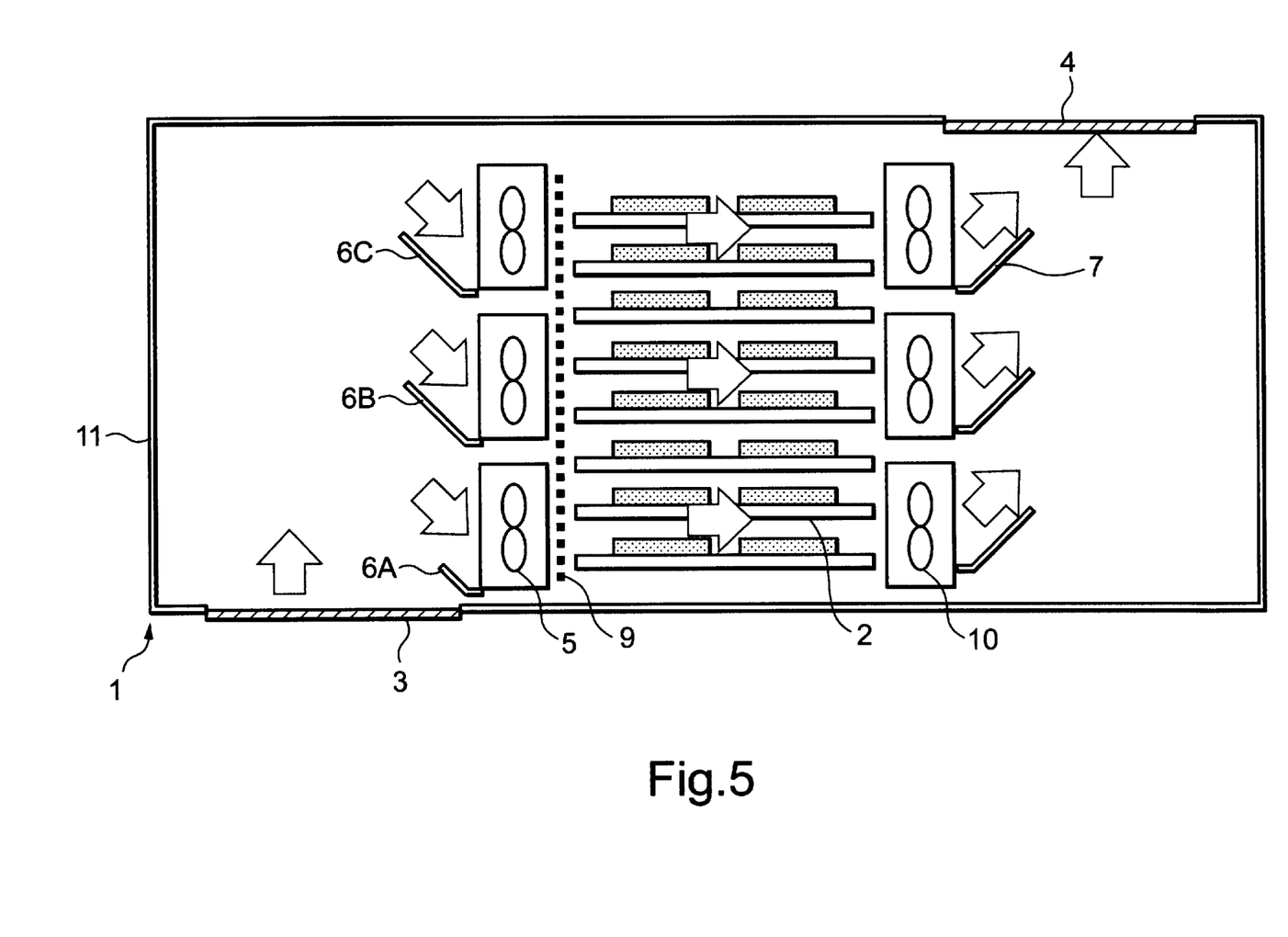
FIG. 5 is a sectional view showing a fifth embodiment of the present invention.
Figure 6:
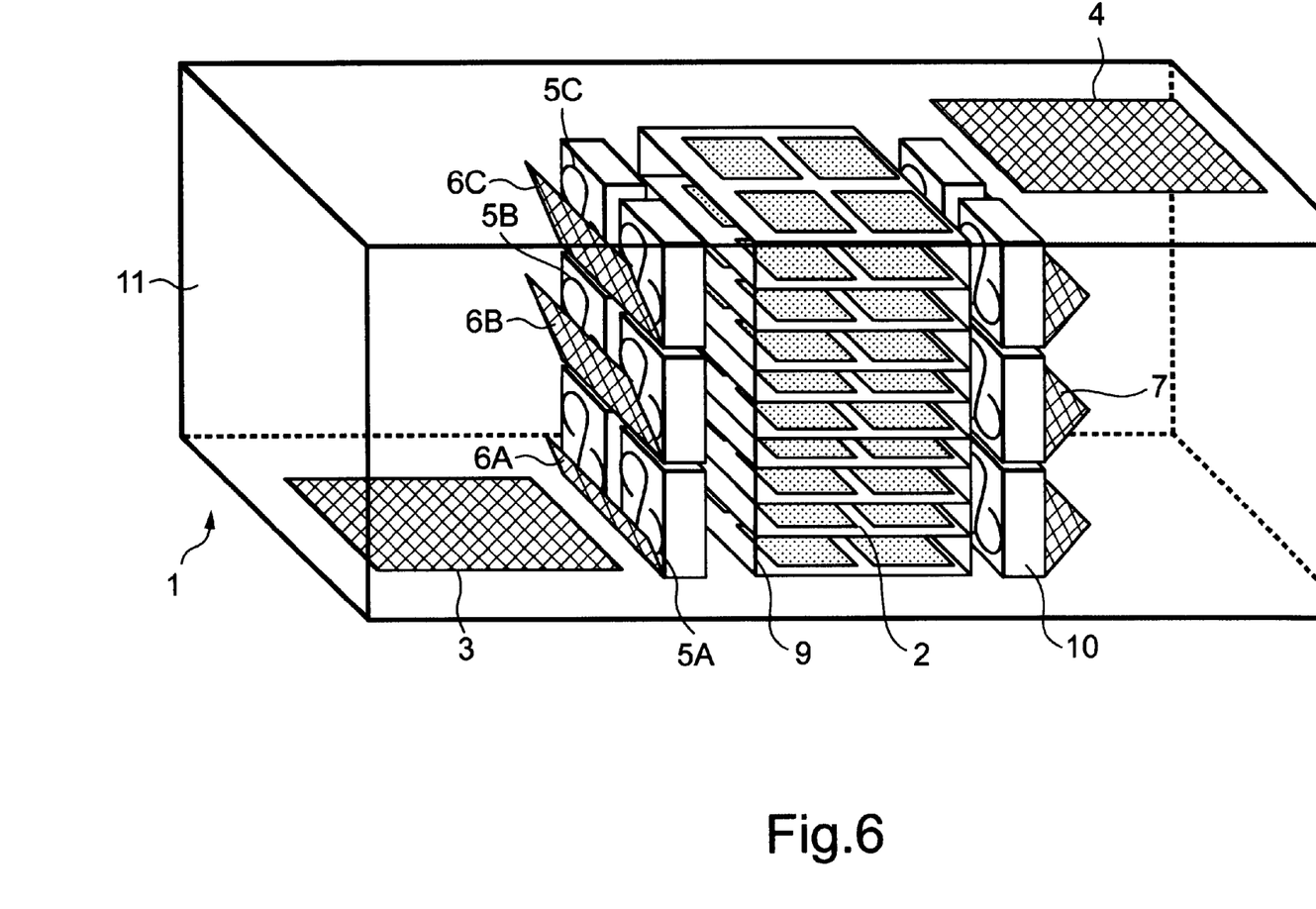
FIG. 6 is a perspective view showing the fifth embodiment of the present invention.

FIGS. 5 and 6 are a sectional view and a perspective view of the embodiment used in a fifth embodiment of the present invention.

In the embodiment shown in FIG. 5, in addition to the third embodiment shown in Fig, a plurality of fans 10 are inserted also between the circuit boards 2 and the exhaust-side guides 7.

The present invention increases the airing resistance and therefore slightly increases the static pressure at the fan working points. This requires somewhat powerful fans. However, as compared with a conventional system in which powerful fans are used to blow the wind onto all the circuit boards at a predetermined speed, less powerful fans would satisfy the requirements in the embodiments because the wind blows evenly onto the circuit boards regardless of where they are arranged.

According to the present invention, the wind blows onto the plurality of circuit boards evenly in an electronic device in which a plurality of multistage circuit boards are arranged vertically. This ensures a high cooling efficiency of the circuit boards. In addition, the present invention increases the minimum wind speed and therefore ensures a sufficient cooling effect with smaller fans. This results in lower power consumption and lower noises of the fans and smaller wind amounts in the air conditioning system in the machine room. Another advantage is that the inlet port provided on the bottom of the cabinet may be provided directly below the fans. This allows the inlet port to be provided freely and the cabinet to be designed and arranged freely.

What is claimed is:

1. An electronic device cooling system comprising:

a cabinet;

a plurality of circuit boards, installed in said cabinet, having electronic parts thereon;

an inlet port through which air is taken into said cabinet; and a plurality of inlet-side guides, arranged in parallel on an inlet port side of said plurality of circuit boards in a direction of a flow of the air taken in from said inlet port, guiding said air taken in from said inlet port away from said plurality of circuit boards.

2. The electronic device cooling system according to claim 1, wherein each said inlet-side guides inclined at a predetermined angle toward a side opposite to said inlet port.

3. The electronic device cooling system according to claim 2, further comprising a plurality of fans blowing onto said circuit boards the air guided by said plurality of inlet-side guides.

4. The electronic device cooling system according to claim 2, wherein at least one of said plurality of inlet-side guides near said inlet port is shorter than the other inlet-side guides.

5. The electronic device cooling system according to claim 2, wherein said predetermined angle ranges from 30 degrees to 45 degrees.

6. An electronic device cooling system comprising:

a cabinet;

a plurality of circuit boards, installed in said cabinet, having electronic parts thereon;

an inlet port through which air is taken into said cabinet;

a plurality of inlet-side guides, arranged in parallel on an inlet port side of said plurality of circuit boards in a direction of a flow of the air taken in from said inlet port, guiding said air taken in from said inlet port; and a plurality of fans blowing onto said circuit boards the air guided by said plurality of inlet-side guides, wherein said fans are arranged between said circuit boards and said inlet-side guides.

7. The electronic device cooling system according to claim 6, further comprising a mesh member inserted between said plurality of circuit boards and said fans.

8. An electronic device cooling system comprising:

a cabinet;

a plurality of circuit boards, installed in said cabinet, having electronic parts thereon;

an exhaust port through which air is exhausted from said cabinet;

a plurality of exhaust-side guides, arranged in parallel on an exhaust port side of said plurality of circuit boards in a direction of a flow of the air exhausted from said exhaust port and each inclined at a predetermined angle toward said exhaust port, guiding the air warmed by said electronic parts on said circuit boards; and a plurality of fans exhausting the air warmed by said electronic parts on said circuit boards from said exhaust port via said plurality of exhaust-side guides, said fans being between said circuit boards and said exhaust-side guides.

9. The electronic device cooling system according to claim 8, further comprising:

an inlet port through which the air is taken into said cabinet; and a plurality of inlet-side guides, arranged in parallel in a direction of a flow of the air taken in from said inlet port and each inclined at a predetermined angle toward a side opposite to said inlet port, guiding the air taken in from said inlet port.

10. The electronic device cooling system according to claim 8, further comprising a mesh member inserted between said plurality of circuit boards and said fans.

11. The electronic device cooling system according to claim 8, wherein said predetermined angle ranges from 30 degrees to 45 degrees.

12. The electronic device cooling system according to claim 9, wherein at least one of said plurality of inlet-side guides near said inlet port is shorter than the other inlet-side guides.

13. An electronic device cooling system comprising:

a cabinet;

a plurality of circuit boards, installed in said cabinet and having electronic parts thereon;

an inlet port through which air is taken into said cabinet;

a plurality of inlet-side guides, arranged in parallel in a direction of a flow of the air taken in from said inlet port and each inclined at a predetermined angle toward a side opposite to said inlet port, guiding the air taken in from said inlet port away from said plurality of circuit boards;

a plurality of first fans blowing onto said circuit boards the air taken in through said inlet port and guided by said plurality of inlet-side guides;

an exhaust port through which the air is exhausted from said cabinet;

a plurality of exhaust-side guides, arranged in parallel in a direction of a flow of the air exhausted from said exhaust port and each inclined at a predetermined angle toward said exhaust port, guiding the air warmed by said electronic parts; and a plurality of second fans exhausting the warmed air from said exhaust port via said plurality of exhaust-side guides.

14. The electronic device cooling system according to claim 13, further comprising a mesh member inserted between said plurality of circuit boards and said fans.

15. The electronic device cooling system according to claim 13, further comprising a mesh member inserted between said plurality of exhaust-side guides and said circuit boards.

16. The electronic device cooling system according to claim 13, wherein said predetermined angle ranges from 30 degrees to 45 degrees.

17. The electronic device cooling system according to claim 13, wherein at least one of said plurality of inlet-side guides near said inlet port is shorter than the other inlet-side guides.

18. An electronic device cooling system, comprising:

a cabinet containing a plurality of generally parallel circuit boards and having an air inlet opening with an inlet axis that defines an inlet air path that is generally perpendicular to said plurality of circuit boards, an inlet air speed in the inlet air path decreasing as a distance from said air inlet opening increases; and a plurality of inlet air guides that extend into the inlet air path at an angle that deflects inlet air away from said plurality of circuit boards.

19. The system of claim 18, further comprising at least one fan between said plurality of inlet air guides and said plurality of circuit boards that directs inlet air generally parallel to said plurality of circuit boards.

20. The system of claim 18, further comprising an air outlet opening with an outlet axis that defines an outlet air path that is generally perpendicular to said plurality of circuit boards, and a plurality of outlet air guides that direct outlet air into the outlet air path towards said air outlet opening.

21. The system of claim 20, further comprising at least one fan between said plurality of outlet air guides and said plurality of circuit boards that directs air generally parallel to said plurality of circuit boards.

22. The system of claim 19, wherein a first of said inlet air guides is spaced a first distance from said air inlet opening and extends a shorter distance into the inlet air path than a second of said inlet air guides that is a second distance from said air inlet opening, said second distance being greater than said first distance.

* * * * *